United States Patent [19]

Kuo

[11] Patent Number: 5,741,576
[45] Date of Patent: Apr. 21, 1998

[54] OPTICAL PELLICLE WITH CONTROLLED TRANSMISSION PEAKS AND ANTI-REFLECTIVE COATINGS

[75] Inventor: George Nein-Jai Kuo, Los Altos, Calif.

[73] Assignee: Inko Industrial Corporation, Sunnyvale, Calif.

[21] Appl. No.: 524,724

[22] Filed: Sep. 6, 1995

[51] Int. Cl.⁶ .................... B32B 7/02; G02B 1/10
[52] U.S. Cl. .................. 428/212; 359/586; 359/589; 428/192; 428/336; 428/337; 428/421; 428/532; 428/913
[58] Field of Search ............ 428/421, 212, 428/336, 337, 192, 532, 913; 359/586, 589

[56] References Cited

U.S. PATENT DOCUMENTS

| | | | |
|---|---|---|---|
| 4,046,457 | 9/1977 | Land et al. | 359/586 |
| 4,128,303 | 12/1978 | Onoki et al. | 359/588 |
| 4,131,363 | 12/1978 | Shea et al. | 355/75 |
| 4,282,314 | 8/1981 | Dinella et al. | 430/413 |
| 4,422,721 | 12/1983 | Hahn et al. | 359/585 |
| 4,536,240 | 8/1985 | Winn | 156/74 |
| 4,748,050 | 5/1988 | Takahashi et al. | 427/164 |
| 4,759,900 | 7/1988 | Yen | 428/421 |
| 4,796,973 | 1/1989 | Gordon | 359/350 |
| 4,861,402 | 8/1989 | Gordon | 156/108 |
| 4,966,813 | 10/1990 | Agou et al. | 428/421 |
| 4,996,106 | 2/1991 | Nakagawa et al. | 428/343 |
| 5,028,702 | 7/1991 | Matsumoto et al. | 536/65 |
| 5,059,451 | 10/1991 | Agou et al. | 427/164 |
| 5,339,197 | 8/1994 | Yen | 359/359 |
| 5,392,156 | 2/1995 | Kumagai et al. | 359/586 |
| 5,492,587 | 2/1996 | Hong | 156/246 |

FOREIGN PATENT DOCUMENTS 61-15101  1/1986  Japan .

OTHER PUBLICATIONS

R. Hershel, "Pellicle Protection of Integrated Circuit (IC) Masks," SPIE vol. 275 *Semiconductor Microlithography VI* (1981), pp. 23–28.

*Primary Examiner*—H. Thi Le
*Attorney, Agent, or Firm*—Flehr, Hohbach, Test, Albritton, & Herbert LLP

[57] ABSTRACT

An optical pellicle and method of forming an optical pellicle. The pellicle includes a membrane and an anti-reflective coating covering at least one of the membrane surfaces. The membrane has a wavelength transmission pattern with consecutive first and second maximum transmission peaks where the first maximum transmssion peak corresponds to a wavelength of 365 nm and the second maximum transmission peak corresponds to a wavelength of 436 nm. The pellicle transits at least 99 percent of light striking said pellicle having a wavelength of about 361 nm to 369 nm and at least 99 percent of light striking said pellicle having a wavelength of about 430 nm to 442 nm. In one embodiment, the anti-reflective coating includes at least one intermediate layer having a refractive index less than the refractive index of the membrane, and an outer layer having a refractive index less than the refractive index of the intermediate layer.

7 Claims, 3 Drawing Sheets

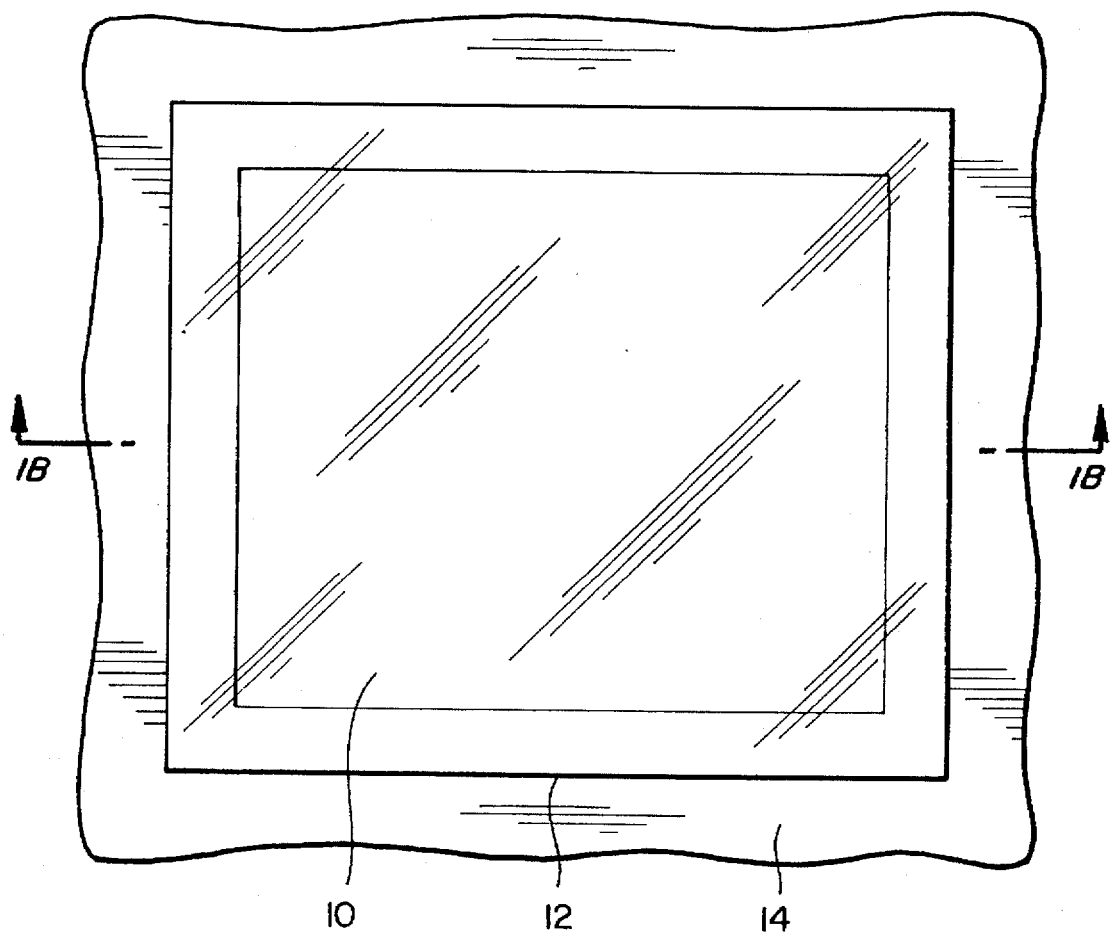
FIG_1A
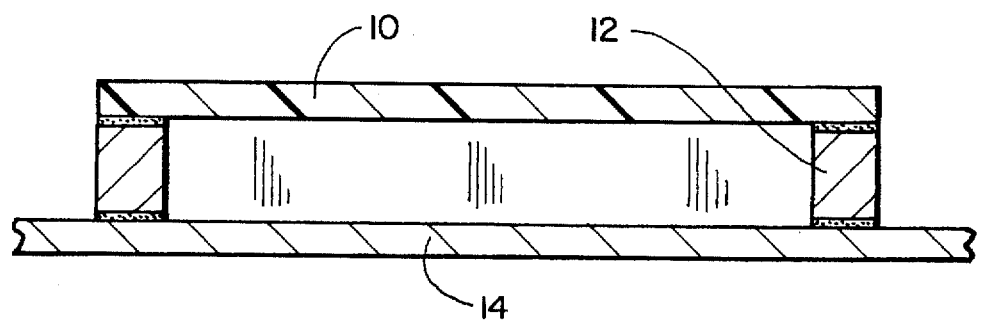
FIG_1B

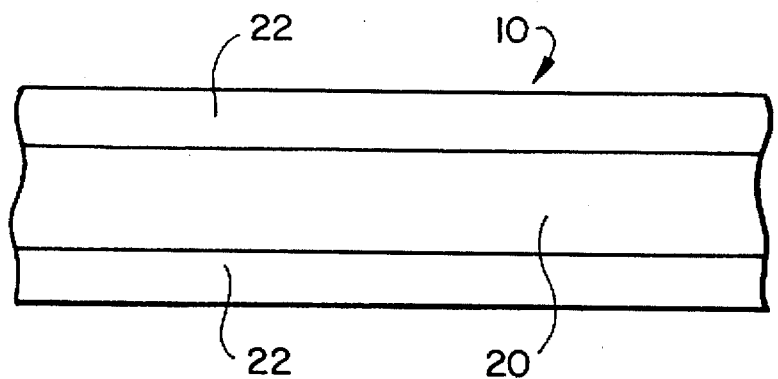
FIG_2
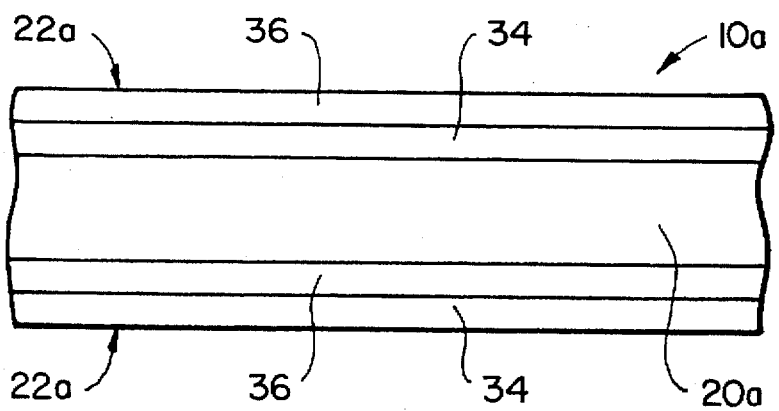
FIG_4
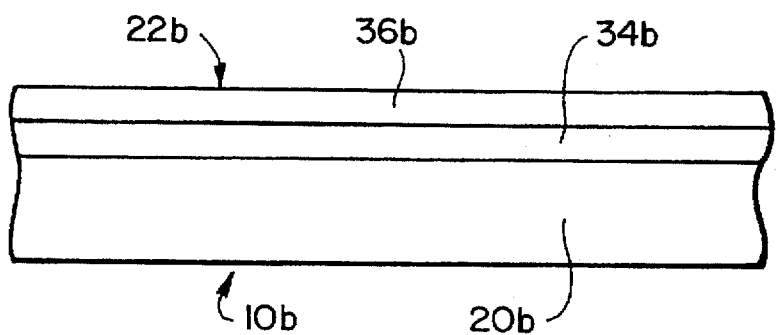
FIG_6

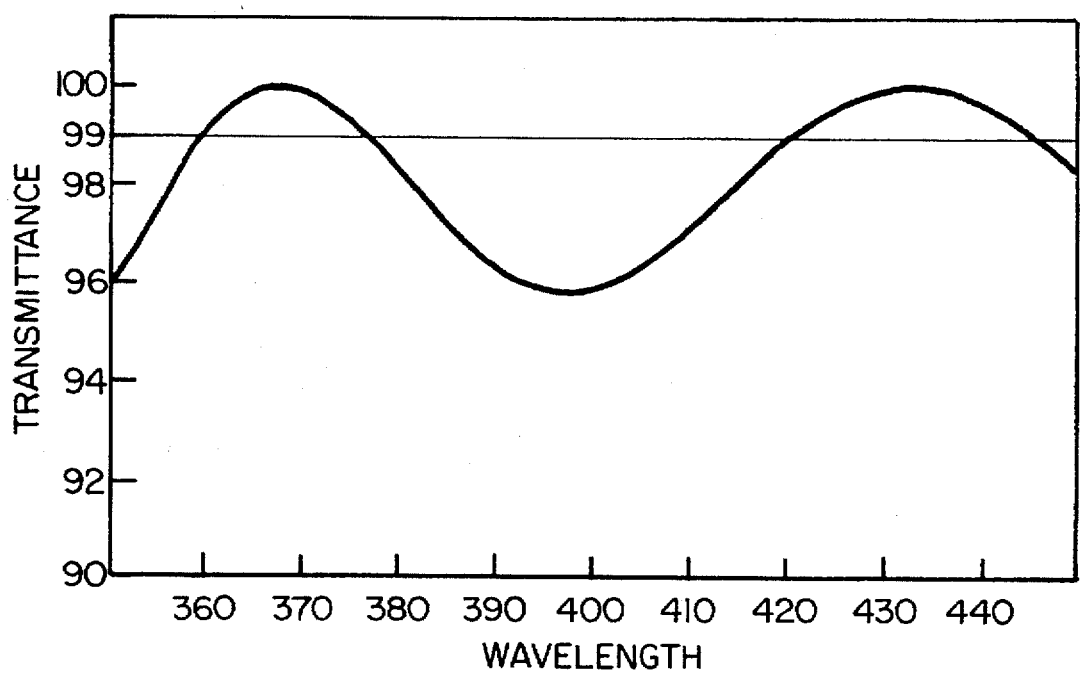
FIG_3
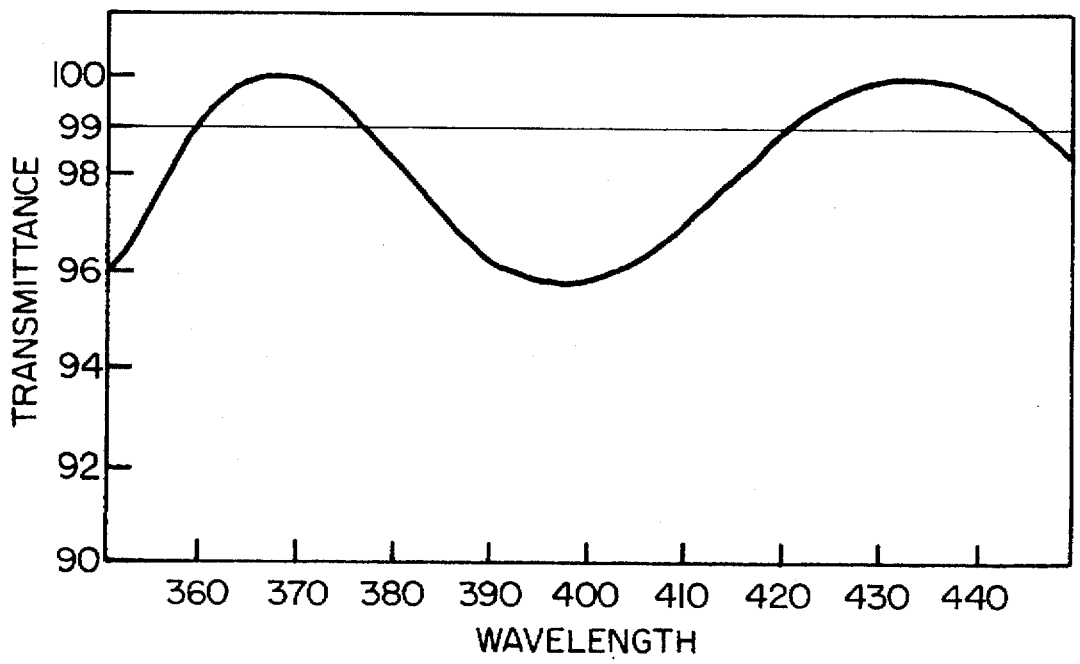
FIG_5

OPTICAL PELLICLE WITH CONTROLLED TRANSMISSION PEAKS AND ANTI-REFLECTIVE COATINGS

BRIEF DESCRIPTION OF THE INVENTION

This invention relates in general to an optical pellicle and, more particularly, to a pellicle with anti-reflective coatings.

BACKGROUND OF THE INVENTION

Optical pellicles are generally used to seal a photomask or reticle, isolating the photomask surface from particulate contamination and eliminating dust or other particles from the focal plane of the photomask pattern during the fabrication of integrated circuits. The optical characteristics of the pellicle are important since the ultraviolet light, electromagnetic radiation and the like used during the photolithography process passes through the pellicle and photomask before reaching the wafer surface. Transmission losses due to absorption or reflection reduce the amount of usable light reaching the wafer surface to lengthen the exposure time required, reducing efficiency and increasing production costs. Many photolithography processes employ Mercury arc lamps which produce a maximum output at about 365 nm and 436 nm. The wavelengths correspond to the I and G lines, respectively, of a Mercury atomic spectrum. The H-line, corresponding to a wavelength of about 405 nm, is no longer used for many applications. Typically, photolithography equipment use either I-line or G-line wavelengths in the range of 365±4 nm and 436±6 nm. A pellicle in which the peak transmission corresponds to the maximum output of the I and G lines of a Mercury arc lamp is desirable because it can be used with either I-line or G-line photolithography equipment.

Preferably, the pellicle transmittance of the I-line and G-line wavelengths should be greater than 98 percent of the incident or illuminating light. A pellicle having a thickness of about 0.72 μm is disclosed by the Ron Hershell article entitled "Pellicle Protection of IC Masks," SPIE Vol. 275 Semiconductor Microlithography VI (1981). The article states that the disclosed pellicle has a transmission peak which corresponds to a wavelength of 436 nm and claims that the pellicle provides better than 99 percent transmission at wavelengths of 436 nm and 540 nm. U.S. Pat. No. 5,339,197 discloses a pellicle which exhibits peak transmittance characteristics at the G, H and I lines. While the disclosed pellicle has a peak transmission at 365 nm and 436 nm, the I-line and G-line peaks are relatively narrow due to the presence of three peaks within the range of 350 nm and 450 nm. A thinner pellicle which has broader high transmittance characteristics for wavelengths surrounding the I and G lines would improve the process margin by allowing a greater percentage of the available I-line or G-line illumination to be used during the photolithography process.

Various pellicles available in the art employ an anti-reflective coating to improve transmission and reduce the interference effects of the pellicle membrane. The pellicle disclosed in U.S. Pat. No. 5,339,197 includes an optical membrane with a refractive index of about 1.5 covered on both sides with a single-layer anti-reflective coating having an index of refraction of about 1.38. The anti-reflective coating reduces the amount of light which is reflected by the pellicle due to the destructive interferences between air and the anti-reflective coating and between the anti-reflective coating and the membrane. However, partial reflection occurs between maximum transmission wavelengths. Another type of pellicle employs an intermediate anti-reflective layer of materials such as Novalac, poly vinylphenol, or polystyrene and an outer anti-reflective layer of a fluorinated polymer. The high refractive index of the intermediate layer, about 1.68, improves the effectiveness of the anti-reflective material. However, the high index film may degrade under UV illumination, resulting in discoloration or reducing the total transmission. A pellicle having an anti-reflective coating which provides an improved, broad transmission curve is desirable.

OBJECTS AND SUMMARY OF THE INVENTION

It is a primary object of this invention to provide a pellicle for protecting photomasks, reticles and the like from particulate contaminants.

It is a further object of the invention to provide a pellicle having an anti-reflective coating having broad transmission characteristics.

It is another object of the invention to provide a pellicle having a multi-layer anti-reflective coating which minimizes reflection from the pellicle.

It is another object of the invention to provide a pellicle having a peak transmission of at least 98 percent at about 365 nm and 436 nm.

It is yet another object of the invention to provide a pellicle having a peak transmission of 99 percent or more for a substantial amount of the output produced by I-line and G-line Mercury arc lamps.

It is a more general object of the invention to provide a pellicle having high transmission characteristics, minimal interference effects and the ability to withstand film degradation and deterioration over time.

In summary, this invention provides an optical pellicle particularly suitable for protecting photomasks, reticles and the like. The optical pellicle includes a membrane having maximum peak transmissions at 365 nm and 436 nm. The peaks are broad, transmitting 99 percent or more of light having a wavelength corresponding to the maximum output range of 361–369 nm and 430 nm and 440 nm of the Mercury arc lamps. The membrane has a thickness of about 0.61 μm±0.5 μm. An anti-reflective coating is applied to at least one surface of the membrane to improve transmission.

In one modification of the invention, the anti-reflective coating includes an outer layer and at least one intermediate layer between the outer layer and the membrane. The intermediate layer has a refractive index which is less than the index of the membrane and the outer layer has a refractive index which is less than the refractive index of the intermediate layer.

Additional objects and features of the invention will be more readily apparent from the following detailed description and appended claims when taken in conjunction with the drawings.

BRIEF DESCRIPTION OF THE DRAWINGS

FIG. 1A is a top plan view of a pellicle in accordance with the invention, shown mounted to a pellicle frame which is mounted to a photomask.

FIG. 1B is an enlarged, fragmentary cross sectional view taken along line 1B—1B of FIG. 1A.

FIG. 2 is a fragmentary, schematic side elevational view of the pellicle of FIG. 1A.

FIG. 3 is a schematic graph showing transmittance versus wavelength of the pellicle of FIG. 1A.

3

FIG. 4 is a fragmentary, schematic side elevational view of another embodiment of the invention.

FIG. 5 is a schematic graph showing transmittance versus wavelength of the pellicle of FIG. 4.

FIG. 6 is a fragmentary, schematic side elevational view of still another embodiment of the invention.

DETAILED DESCRIPTION OF THE INVENTION

Reference will now be made in detail to the preferred embodiment of the invention, which is illustrated in the accompanying figures. Turning now to the drawings, wherein like components are designated by like reference numerals throughout the various figures, attention is directed to FIGS. 1A–3.

FIGS. 1A–3 show a pellicle which is particularly suitable for protecting the surface of a photomask or reticle from particulate contamination and removing particles from the focal plane of the photomask pattern. The pellicle 10 is mounted to a frame 12 which is mounted to a photomask or reticle 14, enclosing the photomask pattern (not shown) within the frame 12. The shape of the frame 12, and the pellicle attached to the frame, is subject to considerable variation depending upon the configuration of the photomask and the constraints of the photolithography equipment.

As is shown particularly in FIG. 2, pellicle 10 includes an optical membrane 20. The optical membrane is formed of a material such as nitrocellulose, cellulose acetate or another suitable deep UV film. In the present embodiment, the optical membrane has a wavelength transmission spectrum with two consecutive maximum transmission peaks—the first occurring at a wavelength of 365 nm and the second occurring at a wavelength of 436 nm. Providing a membrane having a peak transmission at both the 365 nm and 436 nm wavelengths allows the user to employ the same pellicle for I-line and G-line photolithography equipment. The peaks are relatively broad due to the thickness of the optical membrane 20. The optical membrane transmits a high percentage of maximum output of I-line and G-line Mercury arc lamps, which typically falls within the ranges of 361 nm to 369 nm and 430 nm to 442 nm.

An anti-reflective coating 22 substantially covers the optical membrane 20. In the preferred embodiment, the coating 22 is applied to both the upper and lower surfaces of the optical membrane 20 as shown in FIG. 2. Although not shown, in other modifications of the invention the anti-reflective coating may be applied to only one surface of the optical membrane if desired. For optimum protection in reducing reflection interference, the coating 22 preferably substantially covers the entire surface of the optical membrane. The anti-reflective coating reduces the reflectivity of the membrane and improves the transmission of the membrane 20. In the present embodiment, the anti-reflective coating is formed of a suitable material such as a fluorinated polymer having an index of refraction of about 1.33–1.40.

As is known in the art, the optical membrane may be formed by spin coating a polymer-solvent mixture onto a rotating surface. The membrane thickness depends upon the viscosity of the polymer-solvent mixture and the speed and acceleration of the rotating surface. Preferably, the membrane thickness is substantially uniform across the entire membrane. For membranes having a thickness of about 0.61 µm±0.5 µm, the polymer-solvent mixture has a relatively low viscosity on the order of 10 cps. The low viscosity of the mixture offers the advantages of greater control over the thickness and uniformity of the membrane and more efficient filtration. Although thicker films are stronger than the 0.56–0.66 µm film, the optical membrane 20 of the present invention is of sufficient strength to withstand normal handling and inspection conditions. Because of the wider peak-to-peak spacing of the transmission spectrum, changes in membrane thickness due to water absorption or other factors will have a minimal effect on the maximum transmittance of the pellicle. The anti-reflective coating is formed by mixing the fluorinated polymer with a fluorinated solvent which will not dissolve the membrane 20 applying the coating to the exposed surface by spin coating. The anti-reflective coating 22 preferably has a thickness of about 730 Å±100 Å.

FIG. 3 shows the transmission spectrum for the pellicle 10 of the present invention. As is shown in FIG. 3, the pellicle 10 transmits about 99 percent or more of the light having a wavelength of about 360 nm to 378 nm, and about 99 percent or more of the light having a wavelength of about 420 nm to 444 nm. Thus, maximum output of the I-line and G-line Mercury lamps, which is typically in the range of 361 nm to 369 nm and 430 to 442 nm, is transmitted by the pellicle 10. The pellicle 10 of the present invention significantly improves process margins by transmitting a greater percentage of the usable light produced by both I-line and G-line Mercury arc lamps.

FIGS. 4 and 5 show an embodiment of the present invention in which the pellicle 10a includes a multiple-layer anti-reflective coating to further reduce the reflectivity of the film. As is shown in FIG. 4, the anti-reflective coating 22a includes at least one intermediate layer 34 and an outer layer 36. Although only one intermediate layer is shown in FIG. 4, it will be understood that the multiple layer anti-reflective coating may include two or more intermediate layers if desired.

The materials of the optical membrane 20a and the intermediate layer 34 and outer layer 36 of the anti-reflective coating 22a are selected so that the refractive index decreases from the optical membrane 20a to the ambient air adjacent the outer layer 36. The refractive index of the optical membrane is preferably within the range of 1.4 to 1.6, with a nitrocellulose membrane having an index of 1.5. The intermediate layer is formed of a material having a refractive index of about 1.40 to 1.50, while the outer layer is formed of a material having a refractive index of about 1.33 to 1.40. If more than one intermediate layer is employed, the refractive index of the innermost intermediate layer is preferably higher than the next succeeding layer. When an anti-reflective coating is applied to the optical membrane, partial reflection and refraction occurs at the air-coating interface and the coating-membrane coating because of the differences in the refractive index of the different materials. With the anti-reflective coating 22a of the present invention, the difference in refractive index is divided into several smaller steps, reducing the amount of refraction and reflection at each interface. Using two or more anti-reflective layers with a successively increasing refractive index substantially improves the transmission of pellicle 10a.

Suitable materials for the intermediate layer 34 include silane polymers, siloxane polymers, starch derivative polymers and the like. The polymer is mixed with a solvent of alcohol, water or another suitable solvent base which will not dissolve the membrane 20a and applied to the surface of the optical membrane by spin coating. Unlike the higher index intermediate layers employed in the prior art, the materials used for intermediate layer 34 offers the advantage of substantial stability to UV light due to the absence of un-saturated carbon-carbon double bonds which may absorb near UV radiation and degrade the integrity of the anti-reflective coating. The outer layer 36 is formed of a lower index material such as a fluorinated polymer. The lower index polymer is mixed with a fluorinated solvent which will not dissolve the membrane 20 or the intermediate layer 34 and applied to the exposed surface of the intermediate layer 34 by spin coating. The intermediate layer may have a thickness up to about 2000 Å or the intermediate layer may be omitted as in the previously described embodiment. The thickness of each layer is preferably about 730 Å±100 Å. Preferably, the thickness of the intermediate layer 34 and the outer layer 36 is substantially uniform.

FIG. 5 illustrates a schematic graphical illustration showing the transmittance of the pellicle 10 versus wavelength. The pellicle 10a includes an optical membrane 20a with a thickness of about 0.65 µm, an intermediate layer 34 formed of a low refractive index polymer and having a thickness of about 0.06 µm, and an outer later 36 formed of fluorinated polymer and having a thickness of about 0.07 µm. Although an optical membrane thickness of about 0.56 to 0.66 is preferred for its transmission spectrum with broad peaks at 365 nm and 436 nm, it is to be understood that the multiple layer anti-reflective coating 22a may also be of advantage with membranes of other thicknesses. As is shown in FIG. 5, the pellicle 10a has a transmittance greater than 99 percent for wavelengths in the range of 365±10 nm and 436±10 nm. Unlike the pellicles of the prior art, the pellicle 10a of the present invention has a high transmittance over relatively broad peaks corresponding to the wavelengths of 365 nm and 436 nm. The pellicle 10a thereby transmits a high percentage of the light produced by the I-line and G-line Mercury arc lamps, allowing much of the available light to be efficiently used during the photolithography process.

FIG. 6 illustrates another embodiment of the invention. Pellicle 10b generally includes an optical membrane 20b having a thickness of about 0.63 µm±0.5 µm. The membrane 20b is formed of a suitable membrane such as nitrocellulose, cellulose acetate or another suitable deep UV film. One surface of the optical membrane 20b is covered by an anti-reflective coating 22b having at least one intermediate layer 34b and an outer layer 36b. As previously described, the intermediate layer has a lower refractive index than the membrane 20b, and the outer layer 36b has a lower refractive index than the intermediate layer 34b. The anti-reflective coating 22b preferably has a thickness of about 730 Å. As with the previously described embodiment, the membrane 20b and the layers 34b and 36b are formed by spin coating, with the viscosity of the polymer/solvent solution and rotation of the rotating surface being controlled to achieve the desired thickness.

Except as set forth above, the modifications of FIGS. 4–6 resemble those of the preceding modifications and the same reference numerals followed by the letters "a" and "b", respectively, are used to designate corresponding parts.

The present invention provides a pellicle which is particularly suitable for use with photomask patterns which are subjected to I-line and G-line wavelengths during the photolithography process. As is shown by the broad peaks in FIGS. 3 and 5, the pellicle has a transmittance greater than 99 percent for several wavelengths in the range of 365 nm and 436 nm, improving production efficiency by using more of the available light. Reflection and refraction between at the interface between different materials is substantially reduced with the intermediate and outer layers of the anti-reflective coating of the present invention. The multi-layer anti-reflective coating of the present invention also provides more complete protection against reflection.

What is claimed is:

1. An optical pellicle comprising:

a membrane having an upper surface, a lower surface, and a thickness of about 0.61 µm±0.5 µm, said membrane having a wavelength transmission pattern with consecutive first and second maximum transmission peaks, said first maximum transmission peak corresponding to a wavelength of 365 nm and said second maximum transmission peak corresponding to a wavelength of 436 nm, and an anti-reflective coating substantially coveting at least one of said upper and lower surfaces, said pellicle transmitting at least 99 percent of light striking said pellicle having a wavelength of about 361 nm to 369 nm and at least 99 percent of light striking said pellicle having a wavelength of about 430 nm to 442 nm.

2. The optical pellicle of claim 1 in which said pellicle transmits at least 99 percent of light striking said pellicle having a wavelength of about 360 nm to 378 nm and at least 99 percent of light striking said pellicle having a wavelength of about 420 nm to 444 nm.

3. The optical pellicle of claim 1 in which said membrane is selected from the group consisting of nitrocellulose films and cellulose acetate films.

4. The optical pellicle of claim 1 in which said anti-reflective coating substantially covers both said upper surface and said lower surface of said membrane.

5. The optical membrane of claim 1 in which said anti-reflective coating layer is a fluorinated polymer.

6. The optical pellicle of claim 1 in which said membrane has a first refractive index and in which said anti-reflective coating including an outer layer and at least one intermediate layer between said outer layer and said membrane, said intermediate layer having a second refractive index less than said first refractive index of said membrane and said outer layer having a third refractive index less than said second refractive index of said intermediate layer.

7. In combination, the optical pellicle of claim 1 and a pellicle frame having an inner surface, an outer surface and upper and lower edges joining said inner and outer surfaces, said optical pellicle being mounted to one of said edges of said pellicle frame.

* * * * *